(12) United States Patent
Kato

(10) Patent No.: US 8,300,991 B2
(45) Date of Patent: Oct. 30, 2012

(54) WAVEGUIDE-TYPE SEMICONDUCTOR OPTICAL MODULATOR AND METHOD FOR MANUFACTURING THE SAME

(75) Inventor: Tomoaki Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 225 days.

(21) Appl. No.: 12/736,127

(22) PCT Filed: Jan. 21, 2009

(86) PCT No.: PCT/JP2009/050845
§ 371 (c)(1),
(2), (4) Date: Sep. 13, 2010

(87) PCT Pub. No.: WO2009/119145
PCT Pub. Date: Oct. 1, 2009

(65) Prior Publication Data
US 2011/0002575 A1 Jan. 6, 2011

(30) Foreign Application Priority Data
Mar. 28, 2008 (JP) ................................. 2008-085600

(51) Int. Cl.
*G02F 1/035* (2006.01)
*H01L 33/00* (2010.01)
(52) U.S. Cl. ................. 385/3; 385/2; 385/130; 385/131; 385/132; 438/31; 257/E33.001
(58) Field of Classification Search .................. 385/1, 2, 385/3, 14, 40, 129, 130, 131, 132, 141; 438/29, 438/31; 257/E33.001
See application file for complete search history.

(56) References Cited

U.S. PATENT DOCUMENTS

| | | | | |
|---|---|---|---|---|
| 6,198,853 B1* | 3/2001 | Yamada | ............................ | 385/2 |
| 7,514,349 B2* | 4/2009 | Shiota et al. | .................. | 438/604 |
| 7,711,214 B2 | 5/2010 | Tsuzuki et al. | | |
| 7,830,580 B2* | 11/2010 | Kato | ............................ | 359/248 |
| 2004/0052490 A1* | 3/2004 | Miyazaki et al. | ............. | 385/131 |

(Continued)

FOREIGN PATENT DOCUMENTS

JP 11-133367 A 5/1999

(Continued)

OTHER PUBLICATIONS

N. Kikuchi, K. Tsuzuki, E. Yamada, Y. Shibata, N. Kashio, H. Yasaka, T. Ishibashi, "Low Driving Voltage 40 Gbit/s Semiconductor-based Mach-Zehnder Modulator", IEICE Technical Report, LQE, Nov. 2005, p. 41-44.

(Continued)

*Primary Examiner* — Brian Healy
(74) *Attorney, Agent, or Firm* — McGinn IP Law Group, PLLC

(57) ABSTRACT

Provided is a traveling-wave type semiconductor optical phase modulator capable of high speed and low voltage operation by improving an n-SI-i-n-type layered structure. A first exemplary aspect of the present invention is a waveguide-type semiconductor optical modulator including: a semiconductor substrate (101); a first n-type cladding layer (103) and a second n-type cladding layer (108) formed on the semiconductor substrate (101); an undoped optical waveguide core layer (104) and an electron trapping layer (107) formed between the first n-type cladding layer (103) and the second n-type cladding layer (108); and a hole supplying layer (106) formed between the undoped optical waveguide core layer (104) and the electron trapping layer (107).

11 Claims, 8 Drawing Sheets

U.S. PATENT DOCUMENTS

| | | | |
|---|---|---|---|
| 2007/0291809 A1* | 12/2007 | Shiota et al. | 372/50.11 |
| 2008/0037607 A1* | 2/2008 | Hashimoto | 372/45.01 |
| 2009/0203161 A1* | 8/2009 | Hashimoto | 438/39 |
| 2011/0002575 A1* | 1/2011 | Kato | 385/3 |

FOREIGN PATENT DOCUMENTS

| | | |
|---|---|---|
| JP | 2003-177368 A | 6/2003 |
| JP | 2005-99387 A | 4/2005 |
| WO | WO 2006/095776 A1 | 9/2006 |

OTHER PUBLICATIONS

K. Tsuzuki, T. Ishibashi, T. Ito, S. Oku, Y. Shibata, R. Iga, Y. Kondo, Y. Tohmori, "40 Gbit/s s n-i-n InP Mach-Zehnder modulator with a $\pi$ voltage of 2.2V", Electronics Letters, vol. 39, No. 20, 2003, p. 1464-1466.

* cited by examiner

WAVEGUIDE-TYPE SEMICONDUCTOR OPTICAL MODULATOR AND METHOD FOR MANUFACTURING THE SAME

TECHNICAL FIELD

The present invention relates to a semiconductor light-emitting device, and more particularly, to a high-power semiconductor light-emitting device.

BACKGROUND ART

With an explosive increase in demand of a broadband multimedia communication service such as the Internet or a high-definition digital TV broadcast, a dense wavelength-division multiplexing optical fiber communication system, which is, suitable for a long-distance and large-capacity transmission and is highly reliable, has been introduced in trunk networks and metro networks. In access networks, an optical fiber access service spreads rapidly. In such an optical fiber communication system, cost reduction for laying optical fibers as optical transmission lines and improvement of spectral efficiency per optical fiber are required. Therefore, a wavelength-division multiplexing technology which multiplexes multiple optical signals having different wavelengths is widely used.

In an optical transmitter for such a high-capacity wavelength-division multiplexing communication system, an external optical modulator is a key component. In the optical modulator, high speed operation with small wavelength dependence is indispensable. Further, unwanted optical phase modulation (or wavelength chirping) which degrades the waveform of the received optical signal after long-distance transmission should be suppressed as small as possible. A Mach-Zehnder (MZ) optical intensity modulator in which a couple of waveguide type optical phase modulators are embedded into an MZ interferometer is suitable for such a use.

In general, a currently used MZ optical intensity modulator has a couple of waveguide-type optical phase modulators having two optical paths between optical waveguide type multiplexer/demultiplexer of the MZ interferometer monolithically integrated on a lithium niobate (LN: $LiNbO_3$) substrate which is a typical electro-optic crystal. Further, electrodes for applying the electric field to the waveguide-type optical phase modulator are provided in the vicinity thereof. The LN-based MZ optical intensity modulator modules have some problems with the size (electrode length: about 5 cm, module length: about 15 cm), the driving voltage (about 5 $V_{p-p}$), and the like. However, since there is no practical external optical modulator which surpasses the LN-based MZ optical intensity modulator in high-speed long distance optical transmission properties, it is still widely used for an optical transmitter unit or the like in various optical communication systems.

In high speed optical modulation by using this external optical modulator, especially in the high-frequency region in which the frequency of the modulation RF signal is over 1 GHz, the propagating wavelength of the modulation RF signal becomes not negligibly short compared with the electrode length of the optical phase modulator region (the interaction length between the modulated optical signal and the modulation RF signal) in the LN-based MZ optical intensity modulator. Therefore, distribution of the RF signal voltage is no longer regarded as uniform in a longitudinal direction of the electrode which is means for applying electric field to the optical phase modulator. To estimate optical modulation performance exactly, it is required to treat the electrode as a transmission line and treat the modulation RF signal propagating through the electrode as a traveling-wave, respectively. In that case, in order to increase the effective interaction length with the modulated optical signal and the modulation RF signal which are propagating in the optical phase modulator region for improving modulation bandwidth and driving voltage, a so-called traveling-wave type electrode which is devised to make phase velocities $v_o$, $v_m$ as close to each other as possible (phase velocity matching) is required.

In order to realize such optical waveguide type modulators, a III-V compound semiconductor such as gallium arsenide (GaAs) or indium phosphide (InP) can also be used so as to apply materials having a (complex) refractive index which changes as applied electric field changes to an undoped optical waveguide core layer. In the case of such semiconductor-based optical modulators, a semiconductor optical waveguide with the p-i-n structure in which an undoped optical waveguide core layer is sandwiched between a p-type cladding layer and an n-type cladding layer is often used so as to apply the electric field to the core layer by applying reverse bias voltage.

In 1550 nm band mainly used in the optical fiber communication system, a single mode optical waveguide with the p-i-n structure is suitable for practical use. In the case of utilizing the optical waveguide with the p-i-n structure as the transmission line of the modulation RF signal for the traveling-wave type optical modulators, the p-type semiconductor which usually has lower electrical conductivity as a clad layer than the n-type semiconductor decreases the (complex) characteristic impedance (absolute value) of the transmission line to about 20Ω, which is less than half of the typical characteristic impedance (50Ω) of widely-used microwave circuit components. This impedance mismatch leads to degradation of the modulation bandwidth due to reflection or the like and increase in the power consumption of the driving circuit when the modulation RF signal output from the driving circuit is applied to the optical modulator as a transmission line.

For the same reason, the effective refractive index $n_m$ ($=c_0/|v_m|$, $c_0$: velocity of light in free space) which affects the modulation RF signal is about seven on average. This value is about twice the effective refractive index $n_o$ ($=c_0/|v_o|$, about 3.5 in InP) of the optical signal which propagates along the waveguide. This phase velocity mismatch between the modulated optical signal and the modulation RF signal leads to decrease in the effective interaction length between both. Further, there are some problems about the modulation bandwidth or the driving voltage like in the case of the above-mentioned impedance mismatch.

Further, the p-type semiconductor has a larger optical-absorption coefficient than that of the n-type semiconductor. Therefore, when using it as a cladding layer of the long optical waveguide in the traveling-wave type optical modulator, the attenuation of the modulated optical signal due to the absorption in the p-type cladding layer often leads to a higher insertion loss.

In this way, the p-i-n diode structure has some problems as the transmission line of the traveling-wave type optical modulators in achieving lower operating voltage and wider bandwidth.

An n-i-n-type layered structure acquired by replacing the p-type semiconductor cladding layer which is the origin of these problems (of the p-i-n structure) with an n-type semiconductor cladding layer having higher electrical conductivity is considered to be effective for suppressing the above-mentioned impedance mismatch and velocity mismatch. Therefore, smaller driving voltage swing and wider bandwidth by elongating the device size are expected to be compatible. Besides, suppression of the absorption due to the p-type dopant enables lower insertion loss. These features are suitable for the traveling-wave type electrode which has an advantage in realizing high speed and low voltage operation in a semiconductor optical waveguide based optical modulator such as an electroabsorption type optical modulator, or an optical phase modulator.

In the case of the n-i-n layered structure, however, the electric field cannot be applied to the undoped layer because the structure cannot prevent carrier injection to the undoped layer. From the viewpoint of preventing this carrier injection, an n-SI-i-n-type layered structure is considered to be a candidate. In the n-SI-i-n-type structure, a semi-insulating (SI) semiconductor layer doped with impurities having the electron trapping ability is inserted between the undoped optical waveguide core layer and the n-type cladding layer.

As an example for applying this n-SI-i-n-type layered structure, an InP-based semiconductor MZ optical intensity modulator is reported in Non-Patent Document 1. A pair of waveguide type optical phase modulator regions composing this semiconductor MZ optical intensity modulator have the n-SI-i-n-type layered structure composed of an n-InP upper cladding layer, an SI—InP layer, a 0.3 µm thick undoped InGaAlAs/InAlAs multiple quantum well core layer in which transition wavelength between each first quantum level of electron and heavy hole is 1370 nm, and an n-InP lower cladding layer. This waveguide is shaped to be a 2 µm wide mesa stripe by using dry etching technology, and both sides of the mesa stripe are buried with a SiN film and a low-permittivity polymer (benzo-cyclo-butene: BCB). It is a so-called high-mesa ridge structure. By the way, Patent Document 1 can be cited as the related art of the present invention.

[Patent Document 1] Japanese Unexamined Patent Application Publication No. 2005-099387.

[Non-Patent Document 1] Kikuchi Nobuhiro and five other persons, "Low Driving Voltage 40 Gbit/s Semiconductor-based Mach-Zehnder Modulator", Technical report of IEICE, LQE, Nov. 2005, pp. 41-44.

DISCLOSURE OF INVENTION

Technical Problem

The carrier density of the undoped III-V compound semiconductor used as the optical waveguide core layer is about $5 \times 10^{15}$ cm$^{-3}$~$1 \times 10^{16}$ cm$^{-3}$. On the other hand, the SI semiconductor layer having the electron trapping ability may be considered almost the same as p-type semiconductor having an impurity concentration equal to the electron trapping density except the difference of Fermi level. Thus, in the near-interface between the undoped optical waveguide core layer and the SI semiconductor layer, its behavior is considered almost the same as that of p-n junction.

Typical electron trapping density of the SI semiconductor layer is about $5 \times 10^{16}$ cm$^{-3}$~$2 \times 10^{17}$ cm$^{-3}$ in InP grown by widely used Metalorganic vapor phase epitaxy (MOVPE). In short, it is only one order larger than the carrier density of the undoped optical waveguide core layer. Therefore, in the near-interface between the undoped optical waveguide core layer with low carrier density and the SI semiconductor layer with low electron trapping density, the depletion layer in which carriers are depleted spreads widely from the interface to the inside of each layer.

When applying external bias voltage to this structure, in each depletion layer spreading from the interface to the undoped optical waveguide core layer and the SI semiconductor layer respectively, the modulation signal voltage is divided roughly in proportion to the thickness of each depletion layer. In short, when fabricating the waveguide type optical modulator having the n-SI-i-n-type layered structure in the practical epitaxial growth condition, about half of the applied voltage from the outside may be applied at most to the significant undoped optical waveguide core layer contributing to optical modulation. Under such circumstances, the broadband and low voltage operation by the biggest benefit expected from the n-SI-i-n-type layered structure, or good consistence between the phase velocity matching and the characteristic impedance matching, cannot be realized. Further, the driving voltage swing may increase.

As just described, in the n-SI-i-n-type layered structure by which high speed and low voltage operation is expected, the electric field strength in the undoped optical waveguide core layer contributing to the practical optical modulation tends to be lower than that of the above-mentioned p-i-n-type layered structure. As a result, to achieve the same optical modulation efficiency per unit length, higher driving voltage is needed. Further, since the effective solution to overcome this problem is unknown, the practical semiconductor optical modulator having the n-SI-i-n-type layered structure has not been realized yet.

An object of the present invention is to provide a traveling-wave type semiconductor optical modulator capable of high speed and low voltage operation by improving an n-SI-i-n-type layered structure.

Technical Solution

A first exemplary aspect of the present invention is a waveguide-type semiconductor optical modulator including: a semiconductor substrate; first and second n-type cladding layers formed on the semiconductor substrate; an undoped optical waveguide core layer and an electron trapping layer formed between the first and second n-type cladding layers; and a hole supplying layer formed between the undoped optical waveguide core layer and the electron trapping layer.

Advantageous Effects

According to exemplary aspects of the present invention, it is possible to provide a traveling-wave type semiconductor optical phase modulator with the high speed and low voltage operation by improving an n-SI-i-n-type layered structure.

EXPLANATION OF REFERENCE 101, 201 SEMI-INSULATING TYPE SEMICONDUCTOR SUBSTRATE
102, 202 BUFFER LAYER
103, 203 LOWER CLADDING LAYER
104, 204 UNDOPED OPTICAL WAVEGUIDE CORE LAYER
105, 205 DIFFUSION PREVENTING LAYER
106, 206 HOLE SUPPLYING LAYER
107, 207 ELECTRON TRAPPING LAYER
108, 208 UPPER CLADDING LAYER
109, 209 CONTACT LAYER
110, 114, 210, 214 ETCHING STOP FILM
111, 211 OPTICAL WAVEGUIDE STRIPE
112, 212 BURIED LAYER
113, 213 BURIED CONTACT LAYER
116, 216 INSULATING FILM
117, 217 UPPER ELECTRODE
118, 218 LOWER ELECTRODE
119, 219 HIGH RESISTANCE REGION
120, 220 LOW REFLECTION FILM
215 ISOLATION TRENCH
221 OPTICAL MULTIPLEXER/DEMULTIPLEXER
222 OPTICAL WAVEGUIDE BEND

BEST MODE FOR CARRYING OUT THE INVENTION

Figure 1:
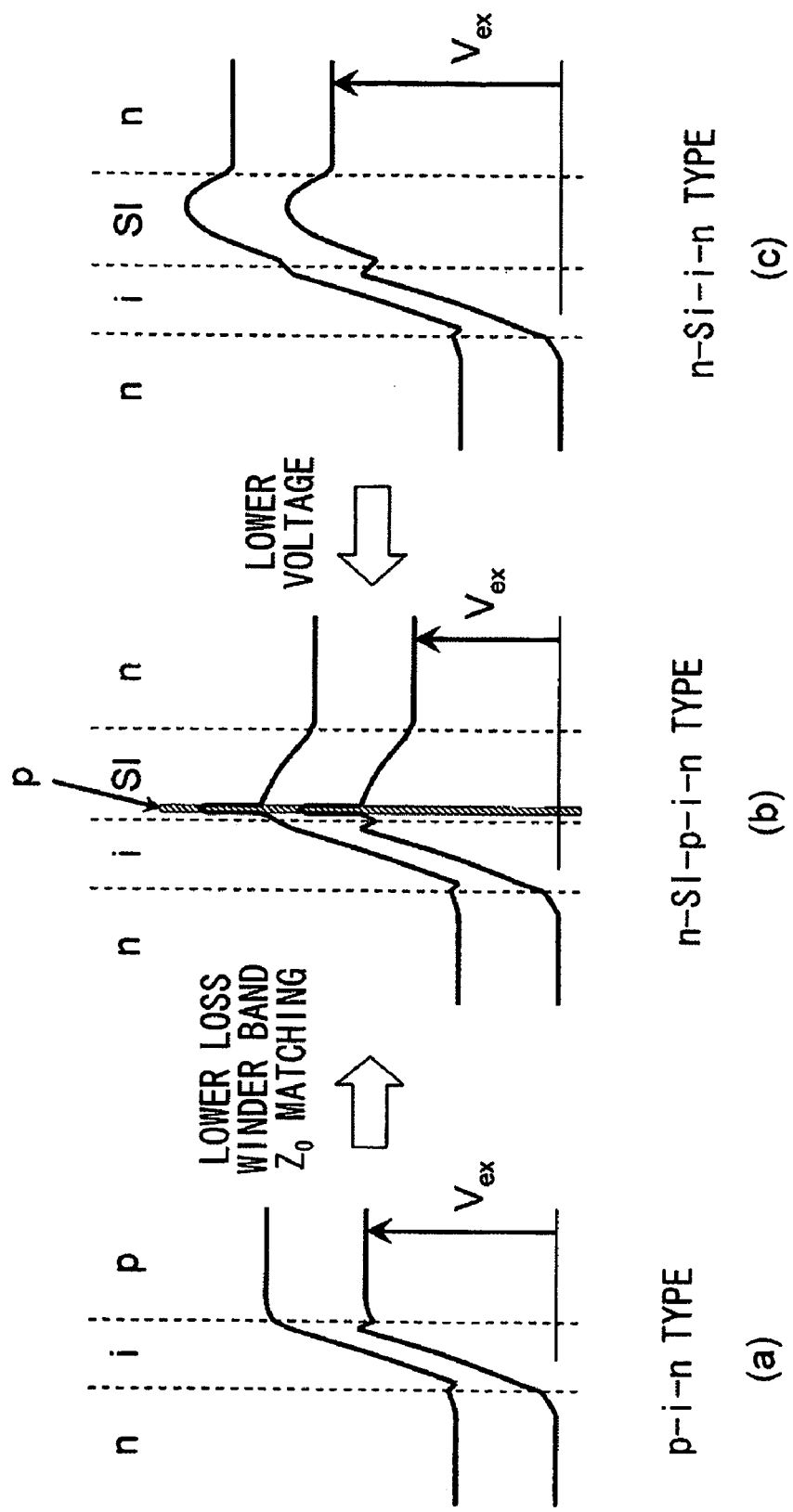
FIGS. 1(a), 1(b) and 1(c) are schematic diagrams showing an operation principle of the present invention.

The inventor particularly focuses on the energy band of the near-interface between the undoped optical waveguide core layer (i layer) and the SI semiconductor layer (SI layer) in the n-SI-i-n-type layered structure. FIG. 1 is a schematic diagram showing a function principle of the present invention. FIG. 1($a$) shows the energy band diagram of a p-i-n-type layered structure, FIG. 1($b$) shows the energy band diagram of an n-SI-p-i-n-type layered structure according to the exemplary aspects of the present invention, and FIG. 1($c$) shows the energy band diagram of an n-SI-i-n-type layered structure, respectively. As shown in FIG. 1($b$), by suppressing the potential gradient in the SI semiconductor layer, the electric field strength of the undoped optical waveguide core layer is improved compared with FIG. 1($c$). Specifically, between the undoped optical waveguide core layer (i layer) and the SI semiconductor layer (SI layer), a hole supplying layer, which is thin enough to neglect influences on propagation characteristics of an optical signal practically, is formed. This hole supplying layer has higher electron trapping ability than that of the SI semiconductor layer.

This thin hole supplying layer steepens the potential gradient formed from the contact interface between the undoped optical waveguide core layer and the SI semiconductor layer to the inside of the SI semiconductor layer in the n-SI-i-n-type layered structure. Further, this thin hole supplying layer makes an effect equivalent to thinning the depletion layer spreading into the inside of the SI semiconductor layer. To realize such a function, the carrier density of the hole supplying layer is required to be higher than both the carrier density of the undoped optical waveguide core layer and the electron trapping density of the SI semiconductor layer. A p-type semiconductor layer is suitable as the hole supplying layer.

On the other hand, this layer has the above-mentioned problem of optical absorption by impurities. To suppress the optical absorption within the practical range, setting the layer thickness is important. Thus, with regard to the hole supplying layer, the impurity concentration range about from $4 \times 10^{17}$ to $2 \times 10^{18}$ cm$^{-1}$ and the thickness range about 10 to 20 nm are practical. By introducing such a hole supplying layer, the thickness of the depletion layer spreading into the SI semiconductor layer can be effectively shrunk. As a result, most of the driving voltage can be applied to the undoped optical waveguide core layer, so the reduction of the driving voltage is expected.

In the case of the epitaxial growth of this semiconductor optical modulator by MOVPE, zinc (Zn) atoms which are typical p-type impurities diffuse in the solid phase from the p-type semiconductor layer applicable to the hole supplying layer to its periphery during the epitaxial growth. Thus, the semiconductor optical modulator has a problem in controlling impurity concentration distribution. When this solid-phase diffusion reaches the undoped optical waveguide core layer, the electrical and optical quality is degraded significantly, which causes lower optical modulation efficiency, lower reliability, higher insertion loss, and lower breakdown voltage.

To suppress this p-type impurity diffusion, for example, a thin diffusion preventing layer is practically inserted between them. Specifically, it is effective to dope silicon (Si) and/or ruthenium (Ru) which are expected to suppress solid-phase diffusion of p-type impurities in III-V compound semiconductor. Further, it is effective to use the hole supplying layer doped with carbon (C) as p-type impurities, solid-phase diffusion of which is relatively small in MOVPE. Furthermore, by molecular beam epitaxy (MBE), beryllium (Be), solid-phase diffusion of which is practically negligible, may be used as p-type impurities.

When this layered structure is treated as the transmission line of the modulation RF signal, suppression of the thickness of the depletion layer spreading into the inside of the SI semiconductor layer by introducing the hole supplying layer is equivalent to increase of the capacitance per unit length. This makes the characteristic impedance decrease to the same level as that of the p-i-n diode structure, which causes lose of the impedance matching state realized by the n-SI-i-n-type layered structure.

However, this problem is easily solved by thickening the undoped optical waveguide core layer. Electric field strength decreases in proportion to the undoped optical waveguide core layer. Here, the thickness of the undoped optical waveguide core layer which contributes to the optical modulation itself increases. Therefore, an optical modulation index per unit length (which is approximately given by a product of a layer thickness and an electric field strength) is maintained substantially constant, and only the characteristic impedance can be controlled independently. Further, unlike the p-i-n-type layered structure, characteristics of the n-SI-i-n-type layered structure are little degraded by inserting the extremely-thin hole supplying layer. Here, the characteristics are that the phase velocity of the modulation RF signal hardly decreases (the effective refractive index $n_m$ of the modulation RF signal is liable to decrease). Therefore, it is easy to realize phase velocity matching, like in the n-SI-i-n-type layered structure.

Exemplary embodiments of the present invention will be described in detail below with reference to the accompanying drawings. Note that the present invention is not limited to exemplary embodiments described below. The following descriptions and drawings are simplified as appropriate to clarify the explanation.

First Embodiment

Figure 2A:
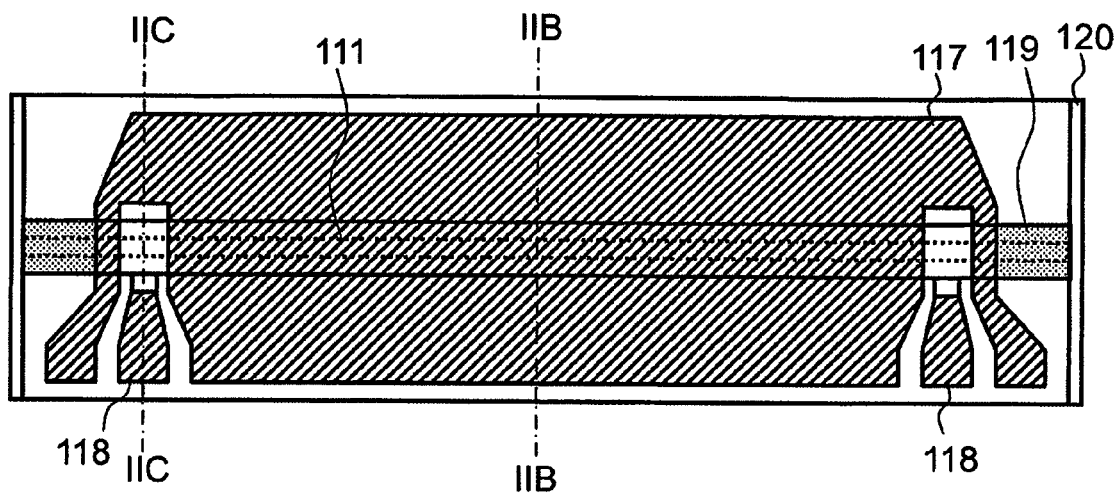
FIG. 2A is a plan view and a cross-sectional view showing a waveguide-type semiconductor optical modulator according to a first embodiment.
Figure 2B:
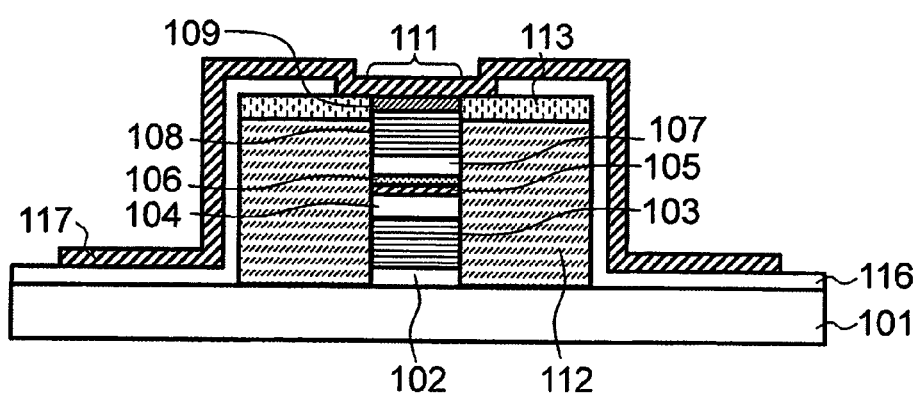
FIG. 2B is a plan view and a cross-sectional view showing the waveguide-type semiconductor optical modulator according to the first embodiment.
Figure 2C:
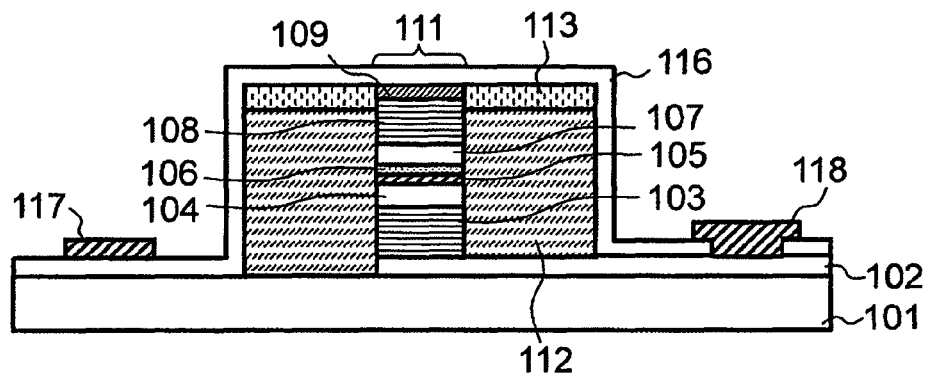
FIG. 2C is a plan view and a cross-sectional view showing the waveguide-type semiconductor optical modulator according to the first embodiment.

Next, a first embodiment of the present invention is described with reference to figures. FIGS. 2A to 2C are a plan view and cross-sectional views showing a waveguide-type semiconductor optical modulator according to the first embodiment of the present invention. FIG. 2A is a plan view, FIG. 2B is a IIB-IIB cross-sectional view of FIG. 2A, and FIG. 2C is a IIC-IIC cross-sectional view of FIG. 2A. As shown in FIGS. 2A to 2C, the waveguide-type semiconductor optical modulator according to the first embodiment has a so-called semi-insulating buried hetero (SI-BH) structure in which an optical waveguide stripe 111 formed on a semi-insulating type semiconductor substrate 101 is buried by a buried layer 112 and a buried contact layer 113. Here, the optical waveguide stripe 111 includes a buffer layer 102, a lower cladding layer 103, an undoped optical waveguide core layer 104, a diffusion preventing layer 105, a hole supplying layer 106, an electron trapping layer 107, an upper cladding layer 108, and a contact layer 109.

Figure 3A:
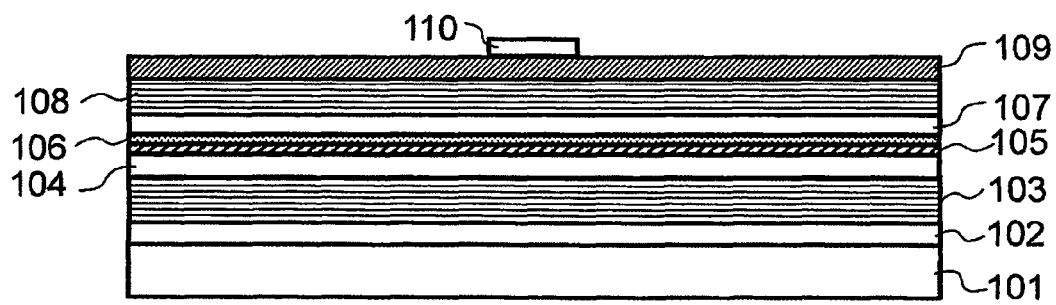
FIG. 3A is a cross-sectional view showing a fabrication process of the waveguide-type semiconductor optical modulator according to the first embodiment.
Figure 3B:
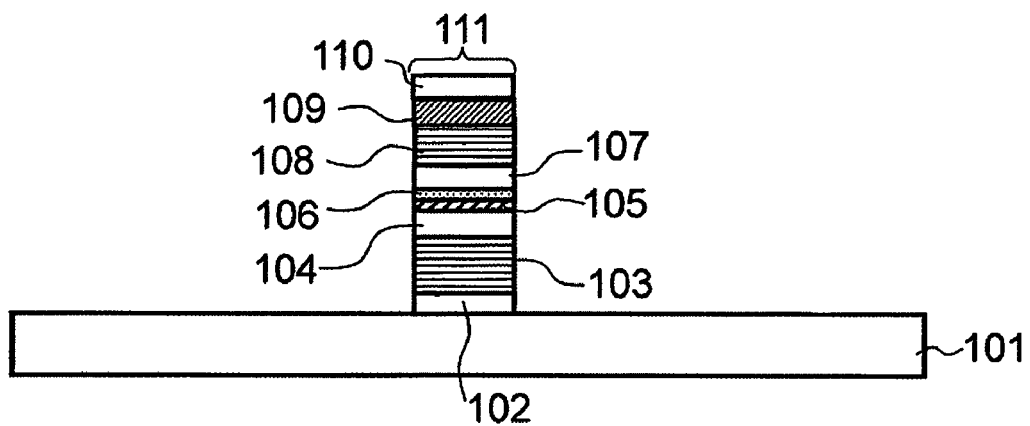
FIG. 3B is a plan view and a cross-sectional view showing a fabrication process of the waveguide-type semiconductor optical modulator according to the first embodiment.
Figure 3C:
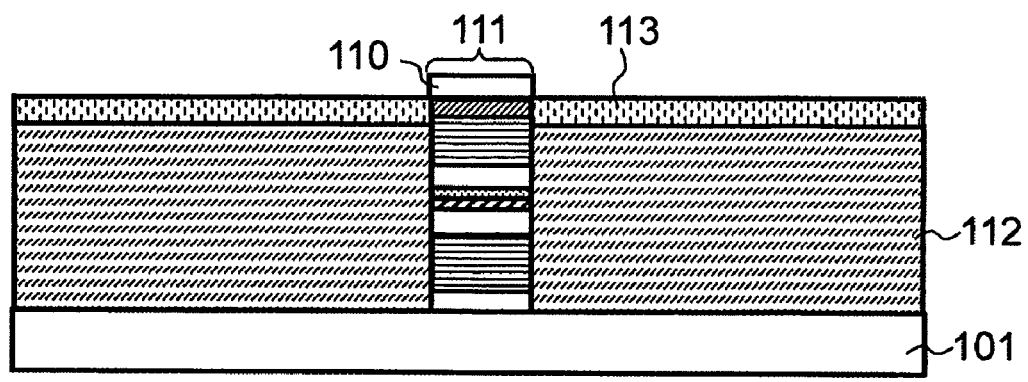
FIG. 3C is a plan view and a cross-sectional view showing a fabrication process of the waveguide-type semiconductor optical modulator according to the first embodiment.

Next, a method of fabricating the waveguide-type semiconductor optical modulator according to the first embodiment is described with reference to FIGS. 3A to 3D. Firstly, as shown in FIG. 3A, the buffer layer 102, the lower cladding layer 103, the undoped optical waveguide core layer 104, the diffusion preventing layer 105, the hole supplying layer 106, the electron trapping layer 107, the upper cladding layer 108, and the contact layer 109 are successively formed on the semi-insulating type semiconductor substrate 101 through a first epitaxial growth. Then, as shown in FIG. 3B, by forming a stripe of the etching stop film 110 on this surface and etching it, the optical waveguide stripe 111 is formed. Next, as shown in FIG. 3C, the optical waveguide stripe 111 is buried by the buried layer 112 and the buried contact layer 113 through a second epitaxial growth, and a so-called semi-insulating buried hetero (SI-BH) structure is formed.

Figure 3D:
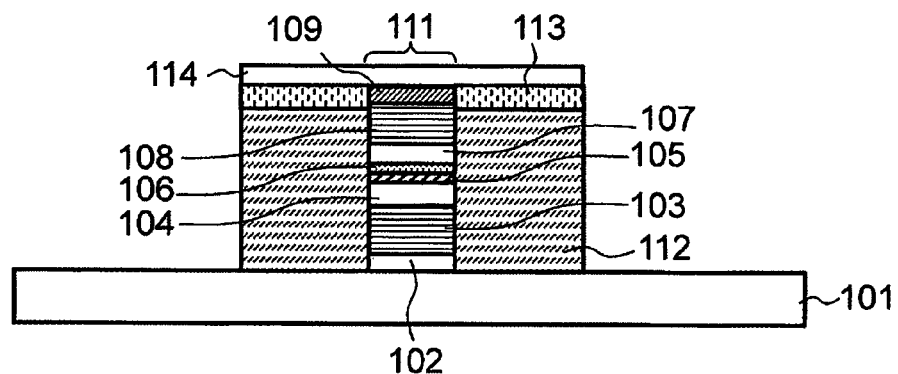
FIG. 3D is a plan view and a cross-sectional view showing a fabrication process of the waveguide-type semiconductor optical modulator according to the first embodiment.

Next, as shown in FIG. 3D, an etching stop film 114 is formed on this surface, and the buried layer 112 and the buried contact layer 113 are etched to a desired width. After an insulating film 116 is formed on this surface and an aperture is formed near the contact layer 109, an electrode film is formed on the entire surface. Then, this electrode film is separated into an upper electrode 117 and a lower electrode 118 by photolithographic technique and etching. To prevent the modulation RF signal from propagating near the end faces through which signal light enters and exits, a high resistance region 119 having lower electrical conductivity is formed by ion implantation after the contact layer 109 and the buried contact layer 113 are partially removed. Finally, both ends of the optical waveguide are cleaved, the end faces through which signal light enters and exits are formed by covering a low reflection film 120 on both end faces. Thus, the waveguide-type semiconductor optical modulator shown in FIGS. 2A to 2C is obtained.

Next, operation of this waveguide-type semiconductor optical modulator is described. To form a single-mode optical waveguide for the optical signal in the working waveband (to meet the single-mode waveguide condition), relations among the thickness, refractive index, and stripe width of each layer are designed properly in advance in the waveguide-type semiconductor optical modulator. Similarly, in order that a phase velocity difference between the modulation RF signal and the modulated optical signal falls within about ±10%, and a difference between the characteristic impedance and the output impedance of the driving circuit falls within about ±10%, the thickness and impurity concentration of each layer are designed properly in advance within the above-mentioned single-mode waveguide condition in the waveguide-type semiconductor optical modulator through which a modulation RF signal is transmitted.

The modulated optical signal (not shown), which enters into one end face of the waveguide-type semiconductor optical modulator by using a lens or the like, propagates along the longitudinal axis of the undoped optical waveguide core layer 104, and exits from the other end face. When the upper electrode 117 and the lower electrode 118 are connected to the driving circuit and the electric field is applied to the undoped optical waveguide core layer 104, the complex refractive index, which influences the modulated optical signal, of the undoped optical waveguide core layer 104 changes due to electroabsorption (Franz-Keldysh effect or quantum confined Stark effect). Here, the rate of change is dependent on the difference between the bandgap of the undoped optical waveguide core layer 104 and energy of the optical signal. Thus, while the signal light passes through this waveguide-type semiconductor optical modulator, its strength and phase change according to the applied electric field. Therefore, it can operate as an optical intensity modulator or an optical phase modulator.

In this structure, between the undoped optical waveguide core layer 104 and the electron trapping layer 107, the hole supplying layer 106 and the diffusion preventing layer 105 which suppresses impurity solid-phase diffusion from the hole supplying layer 106 to the periphery are formed. The hole supplying layer 106 prevents the depletion layer width from spreading into the inside of the electron trapping layer 107. Thus, the driving voltage applied between the upper electrode 117 and the lower electrode 118 is effectively applied to the undoped optical waveguide core layer 104. Further, the thickness and impurity concentration of each layer are designed to be small enough to practically neglect the absorption of the modulated optical signal. As a result, the above-mentioned consistence between the velocity matching and the impedance matching, and low voltage operation are achieved, and the ideal traveling-wave type optical phase modulator can be realized.

Mode for the Invention 1

Next, a mode for the invention 1 of the waveguide-type semiconductor optical modulator according to the first embodiment is described with reference to FIGS. 2A to 2C and FIGS. 3A to 3D. In the mode for the Invention 1, as shown in FIGS. 2A to 2C, an n-InP buffer layer 102, an n-InP lower cladding layer 103 (1.5 μm thick), an undoped optical waveguide core layer 104 (well thickness 10 nm, 12 well layers, barrier layer thickness 10 nm, transition wavelength 1370 nm) having an undoped AlGaInAs/AlGaInAs multiple quantum well structure, a Si+Ru doped InP diffusion preventing layer 105 (50 nm thick), a C doped InP hole supplying layer 106 (50 nm thick), a Ru doped semi-insulating InP electron trapping layer 107 (700 nm thick), an n-InP upper cladding layer 108 (800 nm thick), and an n-InGaAs contact layer 109 (50 nm thick) are laminated in this order on a semi-insulating type semiconductor substrate 101 composed of InP.

As shown in FIG. 3A, these layers are successively formed through a first epitaxial growth by MOVPE. Then, as shown in FIG. 3B, by forming a stripe of the SiN etching stop film 110 with 1.3 μm width on this surface and etching it, a stripe of the optical waveguide 111 is formed. Next, as shown in FIG. 3C, the optical waveguide stripe 111 is buried by a ruthenium (Ru) doped semi-insulating InP buried layer 112 and an n-InGaAs buried contact layer 113 through a second epitaxial growth, and a so-called semi-insulating buried hetero (SI-BH) structure is formed.

Next, as shown in FIG. 3D, a SiN etching stop film 114 is formed on this surface, and the Ru doped semi-insulating InP buried hetero layer 112 and the n-InGaAs buried contact layer 113 are etched to a desired width. After a SiN insulating film 116 is formed on this surface, and an aperture is formed near the n-InGaAs contact layer 109, a Ti—Pd—Au electrode film is formed on the entire surface. Then, this Ti—Pd—Au electrode film is separated into a Ti—Pd—Au upper electrode 117 and a Ti—Pd—Au lower electrode 118 by photolithographic technique and etching. To suppress propagation of the modulation RF signal near the end faces through which signal light enters and exits, a high resistance region 119 having lower electrical conductivity is formed by Ti ion implantation after the n-InGaAs contact layer 109 and the n-InGaAs buried contact layer 113 are partially removed. Finally, both ends of the optical waveguide are cleaved, and the end faces through which signal light enters and exits are formed by covering a low reflection film 120 which has a reflectance equal or less than 0.1% on both end faces. This device has a length of 2 mm and an electrode length of 1.9 mm.

When the modulated optical signal, the wavelength of which is in the range of 1530 to 1570 nm, is entered into the waveguide type optical phase modulator in a TE mode, the insertion loss is about 3 dB which is a practical value. Further, the characteristic impedance of the traveling-wave type electrode to the modulation RF signal is about 50Ω, the modulation bandwidth is 45 GHz, and reflection is equal or less than −13 dB in the range of DC to 45 GHz. Furthermore, when applying a bias voltage of 2.5 V, the phase of the modulated optical signal changes by π radian in the wavelength range from 1530 to 1570 nm.

This device can also be operated as a waveguide type optical intensity modulator for a 1550 nm wavelength modulated optical signal by changing the transition wavelength of the undoped optical waveguide core layer 104 to about 1490 nm, and by positively using the optical absorption when applying the electric field.

Second Embodiment

Figure 4A:
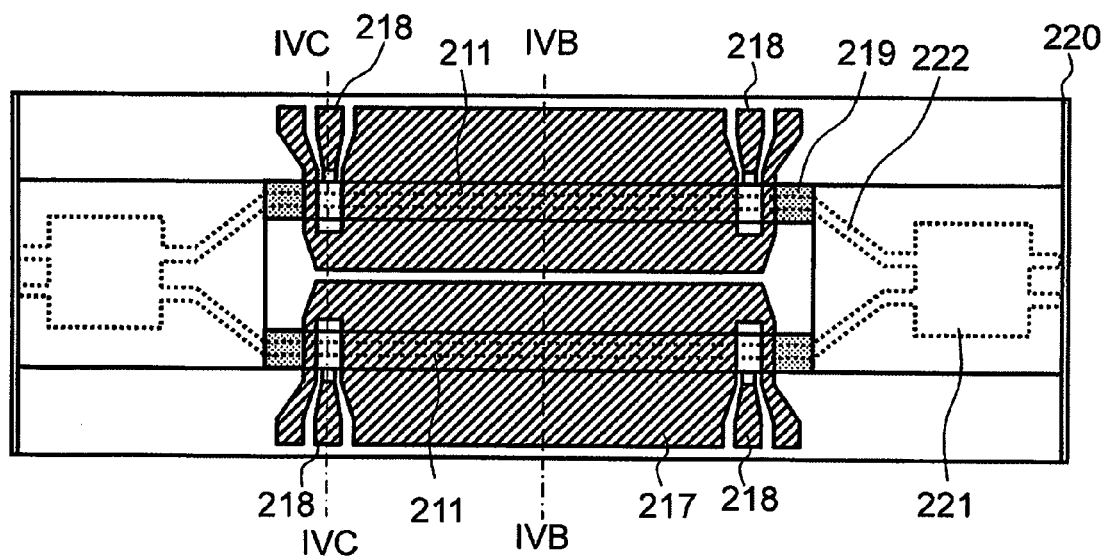
FIG. 4A is a plan view and a cross-sectional view showing a waveguide-type semiconductor optical modulator according to a second embodiment.
Figure 4B:
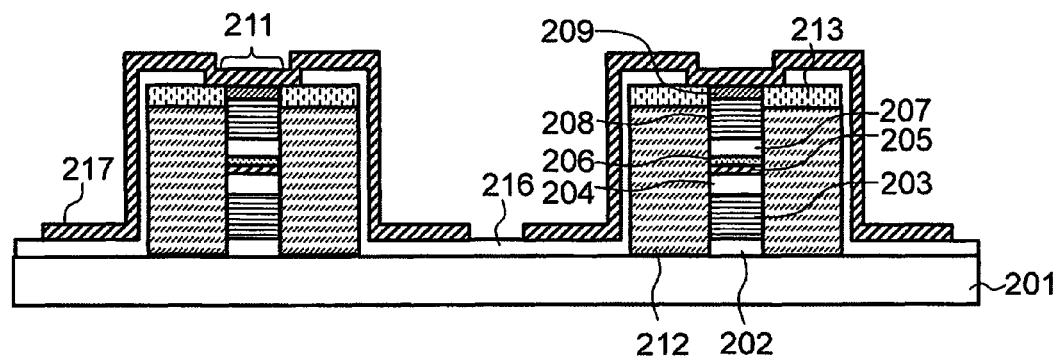
FIG. 4B is a plan view and a cross-sectional view showing the waveguide-type semiconductor optical modulator according to the second embodiment.
Figure 4C:
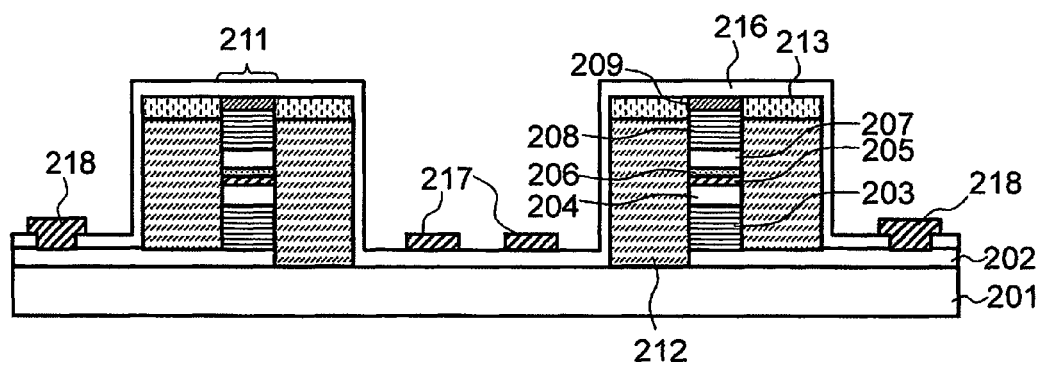
FIG. 4C is a plan view and a cross-sectional view showing the waveguide-type semiconductor optical modulator according to the second embodiment.

Next, a second embodiment of the present invention is described with reference to figures. FIGS. 4A to 4C are a plan view and cross-sectional views showing a waveguide-type semiconductor optical modulator according to the second embodiment of the present invention. FIG. 4A is a plan view, FIG. 4B is a IVB-IVB cross-sectional view of FIG. 4A, and FIG. 4C is a IVC-IVC cross-sectional view of FIG. 4A. The waveguide-type semiconductor optical modulator according to the second embodiment is an MZ optical intensity modulator. As shown in FIGS. 4A to 4C, the MZ optical intensity modulator according to the second embodiment has a so-called semi-insulating buried hetero (SI-BH) structure in which a couple of optical waveguide stripes 211 formed on the semi-insulating type semiconductor substrate 201 are buried by buried layers 212 and buried contact layers 213. Here, each of the optical waveguide stripes 211 includes a buffer layer 202, a lower cladding layer 203, an undoped optical waveguide core layer 204, a diffusion preventing layer 205, a hole supplying layer 206, an electron trapping layer 207, an upper cladding layer 208, and a contact layer 209.

Figure 5A:
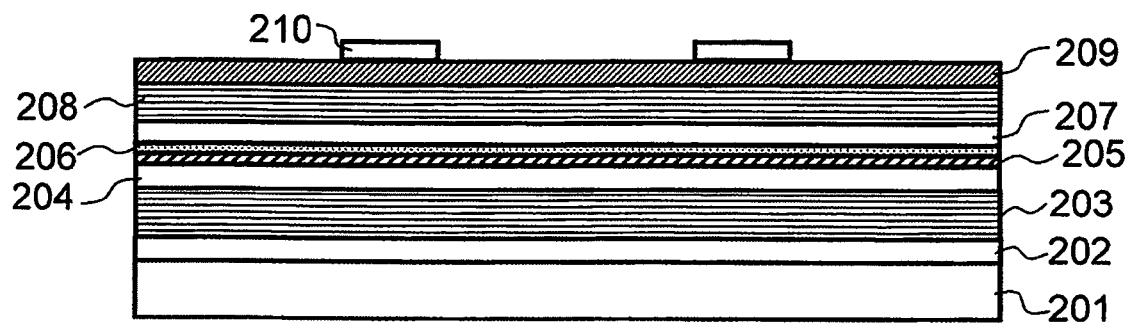
FIG. 5A is a plan view and a cross-sectional view showing a fabrication process of the waveguide-type semiconductor optical modulator according to the second embodiment.
Figure 5B:
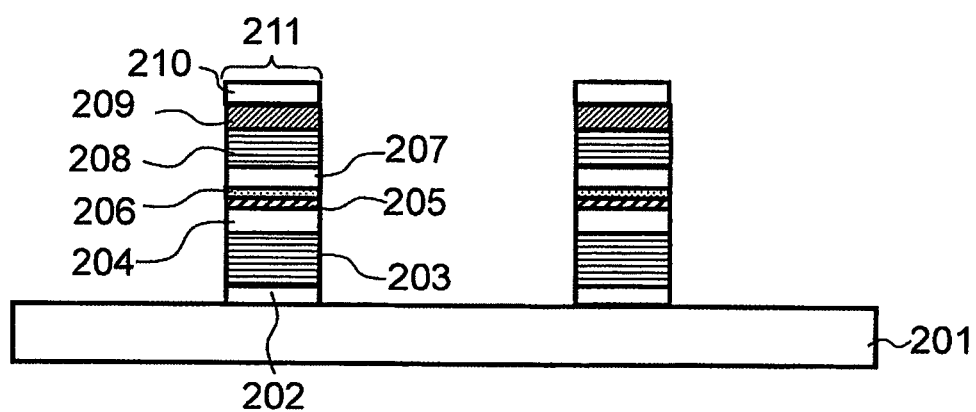
FIG. 5B is a plan view and a cross-sectional view showing a fabrication process of the waveguide-type semiconductor optical modulator according to the second embodiment.
Figure 5C:
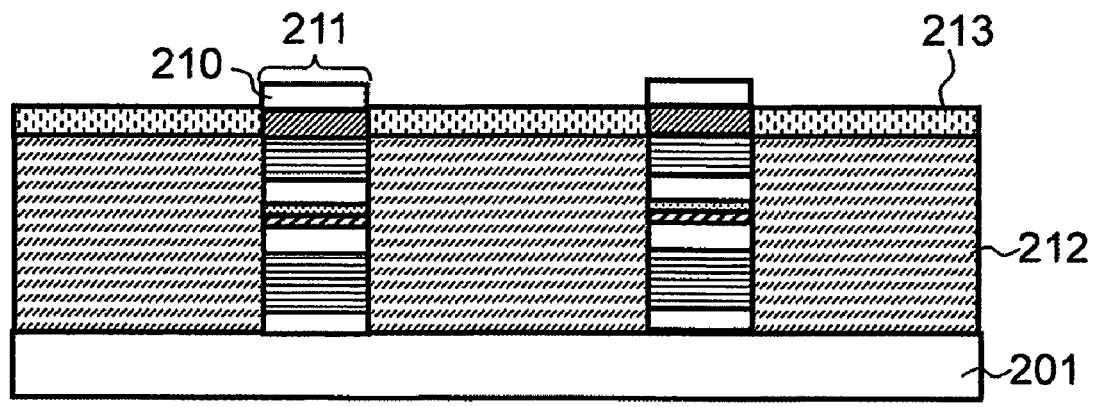
FIG. 5C is a plan view and a cross-sectional view showing a fabrication process of the waveguide-type semiconductor optical modulator according to the second embodiment.

Next, a method of fabricating the MZ optical intensity modulator according to the second embodiment is described with reference to FIGS. 5A to 5D. Firstly, as shown in FIG. 5A, the buffer layer 202, the lower cladding layer 203, the undoped optical waveguide core layer 204, the diffusion preventing layer 205, the hole supplying layer 206, the electron trapping layer 207, the upper cladding layer 208, and the contact layer 209 are successively formed in this order on the semi-insulating type semiconductor substrate 201 through a first epitaxial growth. Then, as shown in FIG. 5B, by forming two stripes of an etching stop film 210 on this surface and etching them, the couple of optical waveguide stripes 211 are formed. Next, as shown in FIG. 5C, each of the optical waveguide stripes 211 is buried by the buried layer 212 and the buried contact layer 213 through a second epitaxial growth, and a so-called semi-insulating buried hetero (SI-BH) structure is formed.

Figure 5D:
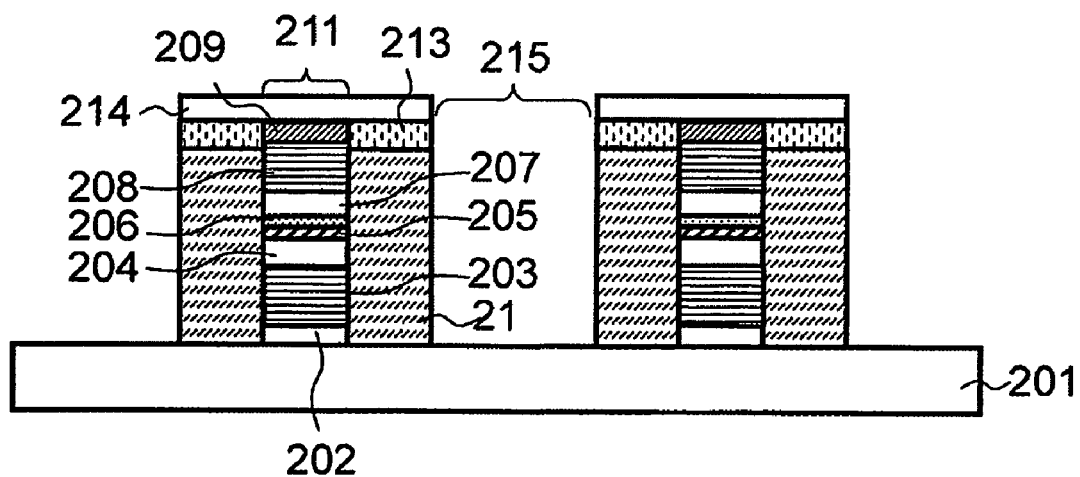
FIG. 5D is a plan view and a cross-sectional view showing a fabrication process of the waveguide-type semiconductor optical modulator according to the second embodiment.

Next, as shown in FIG. 5D, an etching stop film 214 is formed on this surface, and the buried layer 212 and the buried contact layer 213 are etched to a desired width. After an insulating film 215 is formed on this surface and an aperture is formed near the contact layer, an electrode film is formed on the entire surface. Then, this electrode film is separated into an upper electrode 217 and a lower electrode 218 by photolithographic technique and etching. To suppress propagation of the modulation RF signal near the end faces through which signal light enters and exits, a high resistance region 219 having lower electrical conductivity is formed by ion implantation after the contact layer 209 and the buried contact layer 213 are partially removed. The couple of optical waveguide stripes 211 are connected to a two-input/output multimode interference type optical multiplexer/demultiplexer 221 through optical waveguide bends 222. Finally, both ends of the optical waveguide are cleaved, and the end faces through which signal light enters and exits are formed by covering a low reflection film 220 on both end faces. Thus, the waveguide-type semiconductor optical modulator shown in FIGS. 4A to 4C is obtained.

Next, operation of the MZ type optical intensity modulator show in FIG. 4A to 4C is described. To form a single-mode optical waveguide for the optical signal in the working waveband (to meet the single-mode waveguide condition), relations among the thickness, refractive index, and stripe width of each layer are designed properly in advance in a pair of optical phase modulator regions. Similarly, in order that a phase velocity difference between the modulation RF signal and the modulated optical signal falls within about ±10%, and a difference between the characteristic impedance and the output impedance of the driving circuit falls within about ±10%, the thickness and impurity concentration of each layer is designed properly in advance within the above-mentioned single-mode waveguide condition in the waveguide-type semiconductor optical modulator through which a modulation RF signal is transmitted.

The modulated optical signal (not shown), which enters into one end face of the MZ type optical intensity modulator by using a lens or the like, propagates along the longitudinal axis of the undoped optical waveguide core layer 204, and exits from the other end face. When the upper electrode 217 and the lower electrode 218 are connected to the driving circuit and the electric field is applied to the undoped optical waveguide core layer 204, the complex refractive index, which influences the modulated optical signal, of the undoped optical waveguide core layer 204 changes due to electroabsorption (Franz-Keldysh effect or quantum confined Stark effect). Here, the rate of change is dependent on the difference between the bandgap of the undoped optical waveguide core layer 204 and energy of the optical signal. Thus, while the signal light passes through this waveguide-type semiconductor optical modulator, its strength and phase change according to the applied electric field. Therefore, it can operate as an optical intensity modulator.

In this structure, between the undoped optical waveguide core layer 204 and the electron trapping layer 207, the hole supplying layer 206 and the diffusion preventing layer 205 which suppresses impurity solid-phase diffusion from the hole supplying layer 206 to the periphery are formed. The hole supplying layer 206 prevents the depletion layer width from spreading into the inside of the electron trapping layer 207. Thus, the driving voltage applied between the upper electrode 217 and the lower electrode 218 is effectively applied to the undoped optical waveguide core layer 204. Further, the thickness and impurity concentration of each layer are designed to be small enough to practically neglect the absorption of the modulated optical signal. As a result, the above-mentioned consistence between the velocity matching and the impedance matching, and low voltage operation are achieved, and the ideal traveling-wave type optical phase modulator can be realized.

Mode for the Invention 2

Next, a mode for the invention 2 of the waveguide-type semiconductor optical modulator according to the second embodiment is described with reference to FIGS. 4A to 4C and FIGS. 5A to 5D. In the mode for the Invention 2, an n-InP buffer layer 202, an n-InP lower cladding layer 203, an undoped AlGaInAs/AlGaInAs multiple quantum well core layer 204, a Si+Ru doped InP diffusion preventing layer 205, a C doped hole supplying layer 206, a Ru doped semi-insulating InP electron trapping layer 207, an n-InP upper cladding layer 208, and an n-InGaAs contact layer 209 are formed in this order on a semi-insulating InP substrate 201. Then, by forming stripes of a SiN etching stop film 210 on this surface and etching them, a couple of optical waveguide stripes 211 to constitute an MZ interferometer are formed. Next, each of the optical waveguide stripes 211 is buried by a Ru doped semi-insulating InP buried layer 212 and an n-InGaAs buried contact layer 213 through a second epitaxial growth, and a so-called semi-insulating buried hetero (SI-BH) structure is formed. Here, the distance between central axes of a pair of optical waveguide stripes is 50 µm.

Next, an 8 µm wide SiN etching stop film 214 is formed on this surface, and the Ru doped semi-insulating InP buried layer 212 and the n-InGaAs buried contact layer 213 are etched. At the same time, an isolation trench 215 for isolating a pair of the stripe-like optical waveguides from each other is formed. After a SiN film 216 is formed on this surface and an aperture is formed near the contact layer, a Ti—Pd—Au electrode film is formed on the entire surface. Then, this electrode film is separated into a Ti—Pd—Au upper electrode 217 and a Ti—Pd—Au lower electrode 218 by photolithographic technique and etching. To suppress propagation of the modulation RF signal near the end faces through which signal light enters and exits, a high resistance region 219 having lower electrical conductivity is formed by Ti ion implantation after the n-InGaAs contact layer 209 and the n-InGaAs buried contact layer 213 are partially removed. The pair of the stripe-like optical waveguides 211 are connected to the two-input/output multimode interference type optical multiplexer/demultiplexer 221 through the optical waveguide bend 222. Finally, both ends of the optical waveguide are cleaved, and the end faces through which signal light enters and exits are formed by covering a low reflection film 220 which has a reflectance equal or less than 0.1% on both end faces.

The length of this device is 4.5 mm, and the interaction length between the electrode and the signal light is 1.9 mm. When the modulated optical signal, the wavelength of which is in the range of 1530 to 1570 nm, is entered into the waveguide type optical phase modulator in a TE mode, the insertion loss is about 7 dB. Further, the characteristic impedance of the traveling-wave type electrode is about 50Ω, the modulation bandwidth is 45 GHz, and reflection is equal or less than −13 dB in the range of DC to 45 GHz. Further, when the bias voltage is 2.5 V, the modulated optical signal, the wavelength of which is in the range of 1530 to 1570 nm, performs extinction operation, and the extinction ratio is 15 dB.

According to a first effect of the present invention, the problem of the low electric field strength inherent in the n-SI-i-n-type layered structure can be solved. The n-SI-i-n-type layered structure is a doping profile promising high speed and low loss optical modulation as an ideal traveling-wave type semiconductor optical phase modulator. The reason is that the potential gradient in the SI semiconductor layer is suppressed, and the voltage applied from the outside is effectively applied to the undoped optical waveguide core layer by newly inserting a hole supplying layer having higher electron trapping ability than the SI semiconductor layer between the undoped optical waveguide core layer and the SI semiconductor layer.

According to a second effect of the present invention, when realized in the first effect, the ideal high speed and low loss optical modulation, which is the merit of the n-SI-i-n-type layered structure, is prevented from being degraded. The reason is that the first effect can be realized by the structure thin enough to practically neglect influences on propagation characteristics of an optical signal.

According to a third effect of the present invention, the present invention is feasible because the present invention requires no new or special process facility or the like. The reason is that there is no need to change the process because of the same structure except for adding an extremely-thin hole supplying layer, an extremely-thin diffusion preventing layer, or the like in the epitaxial growth of the layered structure for the optical waveguide.

As mentioned above, the waveguide-type semiconductor optical modulator according to the present invention can provide the structure capable of effectively solving the problem of a higher driving voltage in realizing the ultra high speed optical modulator and the integrated optical device for the optical fiber communication system, particularly in trunk networks. Smaller size, higher speed, and lower power are realized in the next generation optical fiber communication system without changing the fabrication process and special components or the like by inserting only an extremely-thin hole supplying layer which is a minimal device to the layered structure.

This application is based upon and claims the benefit of priority from Japanese patent application No. 2008-085600, filed on Mar. 28, 2008, the disclosure of which is incorporated herein in its entirety by reference.

INDUSTRIAL APPLICABILITY

The present invention is applicable to a semiconductor light-emitting device, and more particularly, to a high-power semiconductor light-emitting device.

The invention claimed is:

1. A waveguide-type semiconductor optical modulator comprising:
   a semiconductor substrate;
   first and second n-type cladding layers formed on the semiconductor substrate;
   an undoped optical waveguide core layer and an electron trapping layer formed between the first and the second n-type cladding layers; and
   a hole supplying layer formed between the undoped optical waveguide core layer and the electron trapping layer.

2. The waveguide-type semiconductor optical modulator according to claim 1, wherein a complex refractive index of the undoped optical waveguide core layer to a signal light changes according to a strength of an electric field applied thereto.

3. The waveguide-type semiconductor optical modulator according to claim 1, further comprising an impurity diffusion preventing layer formed between the hole supplying layer and the undoped optical waveguide core layer.

4. The waveguide-type semiconductor optical modulator according to claim 3, wherein the impurity diffusion preventing layer comprises semiconductor doped with Si or Ru.

5. The waveguide-type semiconductor optical modulator according to claim 1, wherein the hole supplying layer is made of semiconductor doped with p-type impurities.

6. The waveguide-type semiconductor optical modulator according to claim 5, wherein the hole supplying layer comprises semiconductor doped with both p-type impurities and impurities having electron trapping ability.

7. The waveguide-type semiconductor optical modulator according to claim 1, wherein the electron trapping layer comprises semi-insulating semiconductor doped with Fe or Ru, or p-type semiconductor doped with p-type impurities.

8. The waveguide-type semiconductor optical modulator according to claim 1, wherein optical waveguide stripes form an optical phase modulator region of a Mach-Zehnder type optical modulator.

9. The waveguide-type semiconductor optical modulator according to claim 1, wherein the waveguide-type semiconductor optical modulator has a buried hetero structure.

10. The waveguide-type semiconductor optical modulator according to claim 1, further comprising a wavelength-tunable light source formed on the semiconductor substrate.

11. A manufacturing method for a waveguide-type semiconductor optical modulator comprising:
   forming first and second n-type cladding layers on a semiconductor substrate;
   forming an undoped optical waveguide core layer and an electron trapping layer between the first and second n-type cladding layers; and
   forming a hole supplying layer between the undoped optical waveguide core layer and the electron trapping layer.

* * * * *